(12) United States Patent
Opsal et al.

(10) Patent No.: US 7,061,627 B2
(45) Date of Patent: Jun. 13, 2006

(54) OPTICAL SCATTEROMETRY OF ASYMMETRIC LINES AND STRUCTURES

(75) Inventors: Jon Opsal, Livermore, CA (US); Allan Rosencwaig, Danville, CA (US)

(73) Assignee: Therma-Wave, Inc., Fremont, CA (US)

( * ) Notice: Subject to any disclaimer, the term of this patent is extended or adjusted under 35 U.S.C. 154(b) by 401 days.

(21) Appl. No.: 10/385,863

(22) Filed: Mar. 11, 2003

(65) Prior Publication Data

US 2005/0041258 A1    Feb. 24, 2005

Related U.S. Application Data

(60) Provisional application No. 60/364,154, filed on Mar. 13, 2002.

(51) Int. Cl.
*G01B 11/30* (2006.01)

(52) U.S. Cl. ..................................... 356/601
(58) Field of Classification Search ............... 356/601, 356/445
See application file for complete search history.

(56) References Cited

U.S. PATENT DOCUMENTS

| | | | |
|---|---|---|---|
| 4,710,642 A | 12/1987 | McNeil | 250/571 |
| 4,999,014 A * | 3/1991 | Gold et al. | 356/632 |
| 5,042,951 A | 8/1991 | Gold et al. | 356/369 |
| 5,159,412 A | 10/1992 | Willenborg et al. | 356/445 |
| 5,166,752 A | 11/1992 | Spanier et al. | 356/369 |
| 5,181,080 A | 1/1993 | Fanton et al. | 356/381 |
| 5,264,912 A | 11/1993 | Vaught et al. | 356/237.5 |
| 5,412,473 A | 5/1995 | Rosencwaig et al. | 356/351 |
| 5,432,607 A | 7/1995 | Taubenblatt | 356/364 |
| 5,596,411 A | 1/1997 | Fanton et al. | 356/369 |
| 5,739,909 A | 4/1998 | Blayo et al. | 356/369 |
| 5,867,276 A | 2/1999 | McNeil et al. | 356/445 |
| 5,867,590 A * | 2/1999 | Eylon | 382/151 |
| 5,880,838 A | 3/1999 | Marx et al. | 356/498 |
| 5,889,593 A * | 3/1999 | Bareket | 356/445 |
| 5,963,329 A | 10/1999 | Conrad et al. | 356/372 |
| 6,081,325 A * | 6/2000 | Leslie et al. | 356/237.2 |
| 6,268,916 B1 | 7/2001 | Lee et al. | 356/369 |
| 6,278,519 B1 | 8/2001 | Rosencwaig et al. | 356/369 |
| 6,383,824 B1 | 5/2002 | Lensing | 438/14 |
| 6,429,943 B1 | 8/2002 | Opsal et al. | 356/625 |
| 6,650,422 B1 | 11/2003 | Singh et al. | 356/601 |
| 2002/0080346 A1* | 6/2002 | Vaez-Iravani et al. | 356/237.2 |
| 2002/0101585 A1 | 8/2002 | Bensch et al. | 356/237.4 |

FOREIGN PATENT DOCUMENTS

WO    WO 02/065545    8/2002

OTHER PUBLICATIONS

D.S. Marx et al., "Polarization quadrature measurement of subwavelength diffracting structures," *Applied Optics*, vol. 36, No. 25, Sep. 1, 1997, pp. 6434-6440.

X. Wang et al., "Measuring and modeling optical diffraction from subwavelength features," *J. Opt. Soc. Am. A*, vol. 18, No. 3, Mar. 2001, pp. 565-572.

(Continued)

*Primary Examiner*—Gregory J. Toatley, Jr.
*Assistant Examiner*—Kara Geisel
(74) *Attorney, Agent, or Firm*—Stallman & Pollock LLP

(57) ABSTRACT

A method for analyzing asymmetric structures (including isolated and periodic structures) includes a split detector for use in a broadband spectrometer. The split has detector has separate right and left halves. By independently measuring and comparing the right and left scattered rays, information about asymmetries can be determined.

8 Claims, 4 Drawing Sheets

OTHER PUBLICATIONS

D.S. Marx et al., "Optical diffraction of focused spots and subwavelength structures," *J. Opt. Soc. Am. A*, vol. 14, No. 6, Jun. 1997, pp. 1268-1278.

J. Opsal et al., "Effects of feature edges on thickness readings of thin oxides," *SPIE* (*Process Module Metrology, Control, and Clustering*, vol. 1594 (1991), pp. 313-321.

* cited by examiner

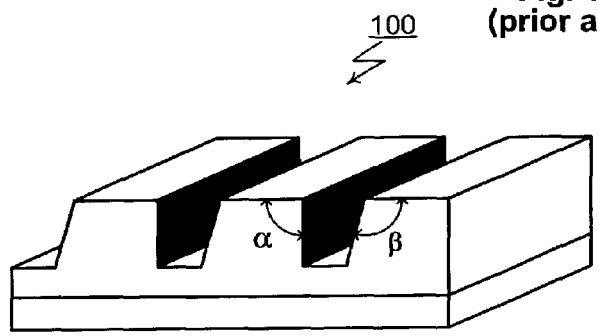
Fig. 1 (prior art)
Fig. 2
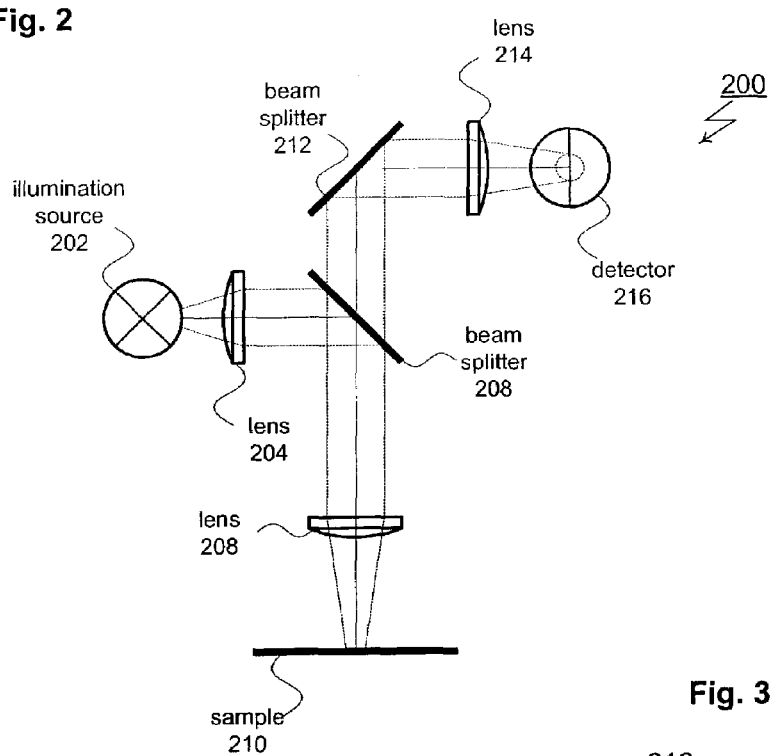
Fig. 3
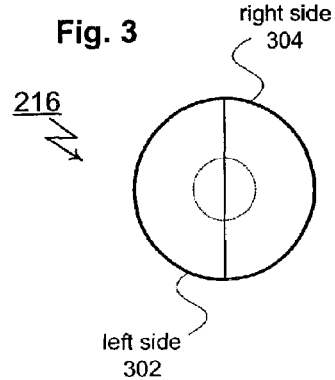

710 detector array 804

710 detector array 804 detector array 802

US 7,061,627 B2

OPTICAL SCATTEROMETRY OF ASYMMETRIC LINES AND STRUCTURES

PRIORITY CLAIM

This application claims priority from prior provisional applications Ser. No. 60/364,154, filed Mar. 13, 2002, and which is incorporated herein by reference.

TECHNICAL FIELD

The subject invention relates to optical devices used to non-destructively evaluate semiconductor wafers. In particular, the present invention relates to methods for measuring asymmetric lines and structures.

BACKGROUND OF THE INVENTION

In the past few years, there has been considerable interest in using optical scatterometry (i.e., diffraction) for performing critical dimension (CD) measurements of the lines and structures that comprise an integrated circuit. It has been shown that optical scatterometry from periodic two-dimensional structures (e.g. line gratings) and from three-dimensional structures (e.g. patterns of vias or mesas) can provide accurate and precise measurements of the spatial profiles of these various lines, vias and mesas. Various optical techniques can be utilized to perform optical scatterometry. These include broadband spectroscopy (U.S. Pat. Nos. 5,607,800; 5,867,276 and 5,963,329), spectral ellipsometry (U.S. Pat. No. 5,739,909) single-wavelength optical scattering (U.S. Pat. No. 5,889,593), and spectral and single-wavelength beam profile reflectance and beam profile ellipsometry (U.S. Pat. No. 6,429,943) (all incorporated herein by reference). In addition it may be possible to employ single-wavelength laser BPR or BPE to obtain CD measurements on isolated lines or isolated vias and mesas. To obtain critical dimension measurements from optical scatterometry signals, one generally employs some rigorous optical diffraction models. As described in above cited patents, these models are then used to generate look-up libraries of optical responses for various combinations of critical dimensions and material properties, or the models are used directly in a real-time iterative process. The above cited patents and patent applications, along with PCT Application WO03/009063, U.S. Application 2002/0158193, U.S. application Ser. No. 10/243,245, filed Sep. 13, 2002, U.S. Application 2001/0051856 A1, PCT Application WO 01/55669 and PCT Application WO 01/97280 are all incorporated herein by reference.

More recently, a new application has emerged for optical scatterometry, overlay registration (overlay) measurements. In overlay measurements one desires to determine with high precision how accurately successive lithographic mask layers have been aligned to preceding layers. Optical scatterometry appears to show considerable promise for performing such measurements using some or all of the techniques described above for CD measurements, with appropriate modifications in the model and analysis.

However, a significant problem for both CD and overlay measurements with optical scatterometry is the problem of asymmetric lines. Asymmetric CD lines (or structures such as vias or mesas) may be the result of stepper artifacts, or from photoresist stripping or material etching processes. FIG. 1 illustrates a simple asymmetric line pattern where the right side wall angle a is smaller than the left side wall angle β Asymmetric overlay lines or patterns are a natural consequence of layer-to-layer misalignment. The problem of asymmetric lines is that in most cases it is not possible to distinguish between right and left asymmetries with conventional optical scatterometry techniques without resort to special or multiple patterns. Discussions related to the use of grating like patterns to evaluate mask overlay can be found in U.S. Pat. Nos. 4,757,207; 6,023,338 and 6,079,256, and U.S. 2002/0158193 all incorporated herein by reference.

It would desirable to be able to evaluate asymmetries in periodic structures. Obtaining such information would be useful in analyzing basic process parameters for fabricating integrated circuits having two dimensional and three dimensional structures (for example, grating line patterns and vias). Such a capability would also be useful to determine in which direction an overlay error lies.

SUMMARY OF THE INVENTION

The present invention provides several methods for analyzing asymmetric structures (including isolated and periodic structures) without resort to special or multiple patterns. For one of these methods, a split detector is used to monitor the reflected probe beam in a broadband spectrometer. In systems of this type, the incident probe beam is typically directed normally against the subject. The split detector has separate right and left halves. By independently measuring and comparing the right and left scattered rays, information about asymmetries can be determined.

A second method is to use two separate detectors in a broadband spectrometer. The first detector is positioned to capture specular reflection and the second is positioned to capture non-specular reflection. By independently measuring and comparing the specular and non-specular reflections, information about asymmetries can be determined. The first detector may be implemented using the split detector described previously. This allows information about right and left scattered rays as well as specular and non-specular reflections to be analyzed simultaneously.

A third method is to introduce polarized light into the probe beam in a broadband spectrometer. For this method, the structure being analyzed (e.g., line or grating) is aligned at a known angle. The polarized light in the probe beam has an angle of polarization that is greater than normal and less than parallel to the alignment of the structure. By measuring the changes in polarity of the reflected probe beam, information about asymmetries can be determined.

A fourth method is to use a non-normal subject alignment within a spectral ellipsometer. The non-normal alignment causes the incident plane of the probe beam to intersect the structure being analyzed (typically a line or grating) at a non-normal angle. For typical implementations, this angle is forty-five degrees. By measuring the changes in polarity of the reflected probe beam, information about asymmetries can be determined.

Another method for analyzing asymmetric structures is to selectively process the detector output of the detectors within a beam profile reflectometry (BPR) system or beam profile ellipsometry (BPE) system. The detectors in BPR/BPE systems are typically configured to include two linear detector arrays. The detectors arrays are typically oriented perpendicularly to each other to provide coverage in two dimensions.

This type of detector can be used to evaluate asymmetries in two axes. For example, if the line or grating structure is parallel to one detector array, it is perpendicular to the second detector array. The perpendicular relationship positions the two halves of the second detector array on opposite sides of the asymmetric structure. By comparing the separate output of the two halves of the second detector array, information about asymmetries can be determined.

For some implementations, the parallel/perpendicular alignment may be replaced by an orientation where the line or grating structure is aligned at an acute angle to both detector arrays. An example would be an implementation where the line or grating structure is aligned at a forty-five degree angle to both detector arrays. The analysis here is similar to the case of parallel/perpendicular alignment except that the output of both halves of both detector arrays is considered. It other cases, it is possible to use a full two dimensional array of detectors (e.g., a grid). A detector array of this type allows asymmetries to be determined along any axis.

Scanning BPR/BPE systems may also be implemented to examine asymmetric structures. In a typical scanning system, the subject is moved translationally during the measurements process. Detector output is recorded as a function of translational position. The position/output information is used to determine information about asymmetries.

The methods described above relate to both CD measurements of asymmetric lines and overlay measurements to distinguish whether overlay displacement is to the right or left of a line.

The methods described above also include any and all possible combinations of SE, BB, BPR and BPE with CD and overlay capability. More specifically, it is known that measurement information from various technologies can be combined to improve the analysis of an unknown sample. Examples of combining measurement technologies are disclosed in some of the above cited references as well as in U.S. Pat. No. 6,278,519 incorporated herein by reference. A combination of information can be relatively simple such as averaging the results from two different measurements. Preferably, all of the measurements are combined and applied to a theoretical model to permit simultaneous regression to an optimal solution.

BRIEF DESCRIPTION OF THE DRAWINGS

FIG. 1 is a perspective view of a semiconductor wafer including an asymmetric grating shown as a typical subject for the present invention.

FIG. 2 is a block diagram of a broadband spectrometer using a split detector as provided by the present invention.

FIG. 3 is a block diagram of a split detector as provided by the present invention.

DETAILED DESCRIPTION OF THE PREFERRED EMBODIMENTS

Figure 4:
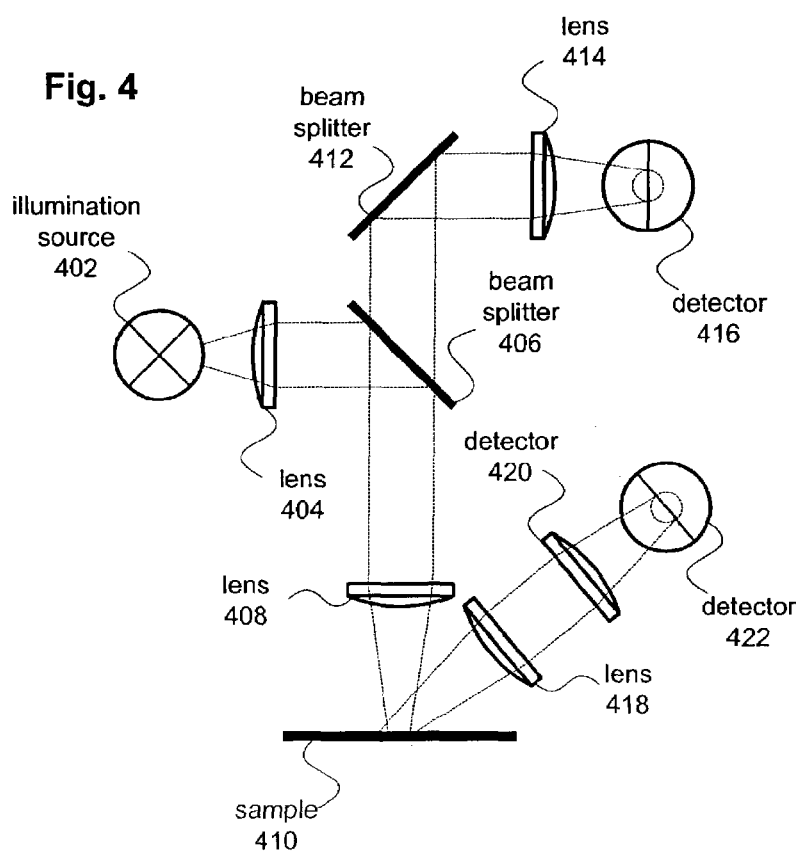
FIG. 4 is a block diagram of a broadband spectrometer using two detectors as provided by the present invention.

The present invention provides several methods for analyzing asymmetric structures (including isolated and periodic structures) included within semiconductor wafers. For one of these methods, an existing optical metrology system is enhanced to provide sensitivity to asymmetries. FIG. 2 shows a specific example of this type of enhancement applied to a broadband spectrometer 200. Spectrometer 200 includes an illumination source 202 that produces a polychromatic probe beam. For this particular implementation, the probe beam passes through a first lens 204, first beam splitter 208 and second lens 208 before reaching a subject 210. Subject 210 is typically a semiconductor wafer and typically includes an isolated or periodic two or three dimensional surface structure such a line, grating, via or pattern of vias. The polychromatic probe beam is reflected by subject 210 and directed through lens 208, first beam splitter 206, second beam splitter 212 and third lens 214 before reaching detector 216. In general, it should be appreciated that the combination of optical components just described is intended to be representative in nature and that other combinations of reflective and refractive optics can be easily substituted.

To provide sensitivity to asymmetries within subject 210, detector 216 uses a split configuration. As shown in FIG. 3 the split configuration of detector 216 includes a left half 302 and a right half 304. Left half 302 and right half 304 operate independently. This allows the separate outputs of the two halves 302, 304 to be independently analyzed and compared. Light received by the two halves 302, 304 will be effected by asymmetries in the sample. With an appropriate analysis, (discussed further below), the differences in the signals can be used to extract information about the asymmetries. In this regard, it should be understood that the output signals at both halves may not be the same even for a symmetric sample. For example, a variation in the angle of attack of the beam with respect to the structure can cause asymmetries to be created in the scattered the signal. Nonetheless, it is believed that asymmetries in the sample itself will also create asymmetries in the scattered light which can be detected and modeled. In accordance with the invention, the subject 210 may be aligned to maximize the asymmetry induced differences between left half 302 and right half 304.

During operation of spectrometer 200, a model is generally used to predict the input received by detector 216. The model is perturbed until the predicted values match the actual input of detector 216 within a desired goodness of fit. Typically, the model is based on rigorously coupled wave analysis (RCWA) but other techniques such as boundary integral evaluation may be used. For the case where asymmetric structures are being analyzed, these models are modified to predict the differing inputs received by left half 302 and right half 304.

FIGS. 2 and 3 describe a case where an existing optical metrology system (a broadband spectrometer) is modified to analyze asymmetric structures. It is important to appreciate that the same technique can be used to modify a range of optical metrology systems including reflectometers and ellipsometers of monochromatic or polychromatic variants. Enhancements of this type are not limited to replacement of existing components (e.g., substitution of split detector 216 for a prior art non-split type). As shown in FIG. 4, enhancement may also include the addition of components not normally found in existing systems. For this specific example, a broadband spectrometer 400 includes an illumination source 402 that produces a polychromatic probe beam. For this particular implementation, the probe beam passes through a first lens 404, first beam splitter 408 and second lens 408 before reaching a subject 410. This particular combination of optical elements is intended to be representative in nature and other combinations of reflective and refractive optics can be easily substituted. Subject 410 is typically a semiconductor wafer and typically includes an isolated or periodic two or three dimensional surface structure such a line, grating, via or pattern of vias.

The polychromatic probe beam is reflected by subject 410 and directed through second lens 408, first beam splitter 406, second beam splitter 412 and third lens 414 before reaching first detector 416. Once again, this particular combination of optical elements is intended to be representative in nature and other combinations of reflective and refractive optics can be easily substituted. First detector 416 may be selected from a range of suitable types including the split detector described above and shown in FIGS. 2 and 3.

Broadband spectrometer 400 includes a fourth lens 418 and a fifth lens 420 to direct a portion of the reflected probe beam to a second detector 422. The light received by second detector 422 is created by non-specular reflection of the probe beam. The light received by first detector 416, on the other hand, is specular reflection. By independently measuring and comparing the specular and non-specular reflections, information about asymmetries can be determined. In cases where first detector 416 is implemented using the split detector described previously, information about right and left scattered rays as well as specular and non-specular reflections can be analyzed simultaneously.

A modeling approach (described above for spectrometer 200) is used to predict the inputs received by first detector 416 and second detector 422. For the case where asymmetric structures are being analyzed, the modeling approach is modified to predict the differing inputs received by first detector 416 and second detector 422. In cases where first detector 416 is implemented as a split detector, the modeling approach must be further modified to account for right and left scattered rays as well as specular and non-specular reflections.

Use of additional sensors (as shown in FIG. 4) is not limited to broadband spectrometry. In fact, a range of optical metrology systems may be used in combination with this technique including reflectometers and ellipsometers of monochromatic or polychromatic variants.

Figure 5:
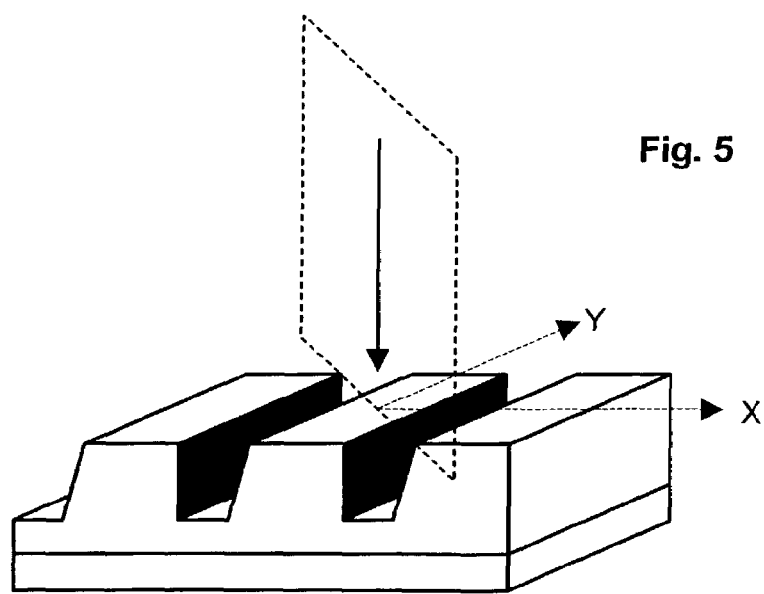
FIG. 5 is a perspective view showing the interaction of a probe beam including a polarized component generated by a broadband spectrometer with a semiconductor wafer including an asymmetric grating.

As shown in FIG. 5 it is also possible to use a structurally unmodified optical metrology system is used to analyze asymmetries. For this example, a broadband spectrometer is used to analyze a subject. The subject (e.g., line or grating) is aligned at a known angle. In FIG. 5 the subject has been positioned to align its grating to be parallel to the Y axis and perpendicular to the X axis. The polarized component of the probe beam is aligned so that its axis of polarization (shown in outline in FIG. 5) has an angle of polarization that is greater than normal and less than parallel to the alignment of the structure (e.g. acutely aligned with the asymmetric structure). In this way, the polarity of the reflected probe beam becomes dependent on the asymmetries of the subject. By measuring the changes in polarity of the reflected probe beam, information about asymmetries can be determined.

Figure 6:
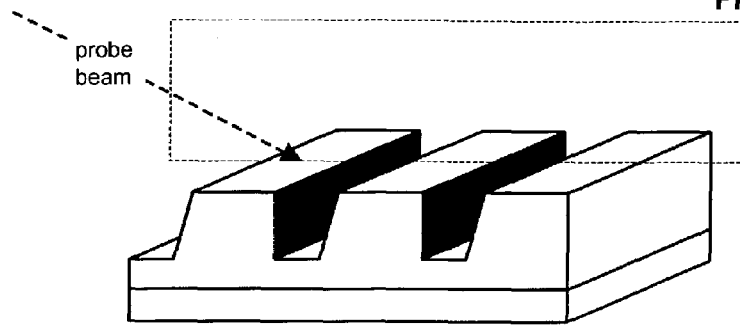
FIG. 6 is a perspective view showing the interaction of a probe beam generated by a spectral ellipsometer with a semiconductor wafer including an asymmetric grating.

FIG. 6 shows another method where a structurally unmodified optical metrology system is used to analyze asymmetries. For this example an ellipsometer is used to analyze a subject. As shown in FIG. 6 the subject that includes an asymmetric grating. A plane perpendicular to the asymmetric grating is shown for reference. The probe beam of the ellipsometer intersects the reference plane at an angle with respect to the plane, to define a non-normal angle of attack. In a typical ellipsometer, the angle of attack is zero—meaning that the probe beam is directed normal to the lines of the grating. This is known as planar diffraction. For the ellipsometry method being described, an intermediate angle of attack is used. This orientation creates conical diffraction. A typical value for the angle of attack is forty-five degrees. This positions the probe beam midway between the X axis and Y axis, increasing the sensitivity to asymmetry. By measuring the changes in polarity of the reflected probe beam, information about asymmetries can be determined.

Figure 7:
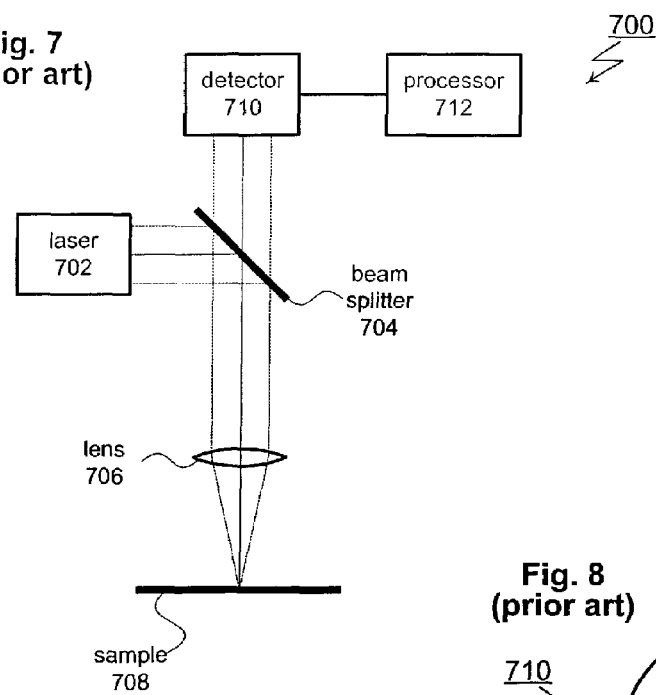
FIG. 7 is a block diagram of a prior art beam profile reflectometer as used by the present invention.

FIG. 7 shows another method where a structurally unmodified optical metrology system is used to analyze asymmetries. For this example, 2 beam profile reflectometry (BPR) system 700 is used to analyze a subject. BPR system 700 includes a laser 702 generating a monochromatic probe beam. The probe beam probe is directed by a beam splitter 704 and focused by a lens 706 before reaching a subject 708. Lens 706 focuses the relatively wide probe beam into a very small spot on subject 708. For the purposes of this description, it is assumed that subject 708 includes an asymmetric structure within the focal point of the probe beam. The transition between the wide probe beam and the small spot on subject 708 creates a wide range of incident angles. The reflected probe beam passes through beam splitter 704 before reaching a detector 710. A processor 712 analyzes the output of detector 710.

Figure 8:
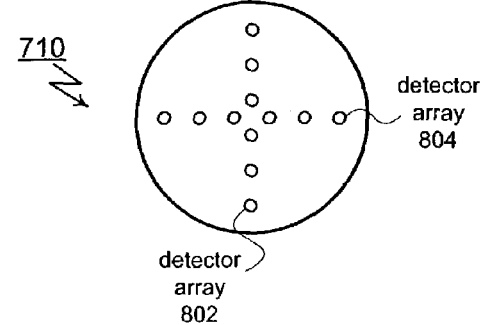
FIG. 8 is a block diagram of a prior art detector as used in the beam profile reflectometer of FIG. 7.

As shown in FIG. 8, a typical implementation for detector 710 includes two linear detector arrays (802 and 804). The detectors arrays 802, 804 are typically oriented perpendicularly to each other to provide coverage in two dimensions. The output of detector arrays 802, 804 is typically accessible on an element-by-element basis. Thus, for example, it is possible to access the output of the topmost element of detector array 802 or the leftmost element of detector array 804. Each array may be on separate detectors. A beam splitter can than be used to divide the reflected beam to land on the two detector arrays. Alternatively, a two-dimensional array (such a CCD element) could also be used for more information.

During operation of BPR system 700, subject 708 is preferably aligned so that one of the detector arrays (either 802 or 804) is parallel to the asymmetric structure of the subject. The other detector array (either 802 or 804) is perpendicular to the asymmetric structure with one half of that detector array (either 802 or 804) on each side of the asymmetric structure. This is shown for a representative subject in FIG. 9. With subject 708 in this alignment, the separate outputs of the two halves of the straddled detector array (in this case, the two halves of detector array 804) are compared to obtain information about asymmetries.

As described previously, a model is generally used to predict the input received by detector 708. For the case where asymmetric structures are being analyzed, the model is modified to predict the differing inputs received by the two halves of detector array 804.

Figure 9:
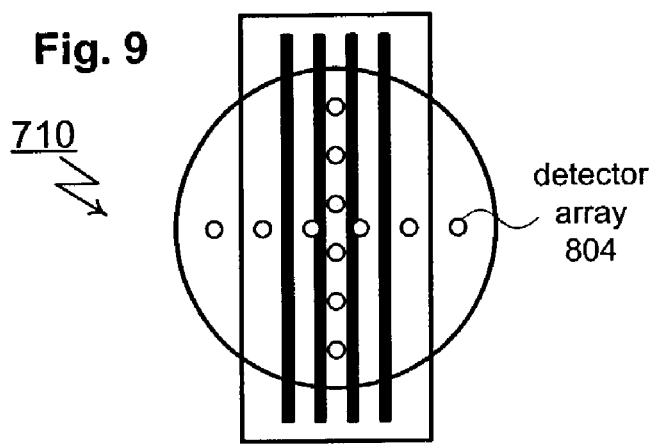
FIG. 9 is a block diagram showing the alignment between an asymmetric subject and the detector of FIG. 8.
Figure 10:
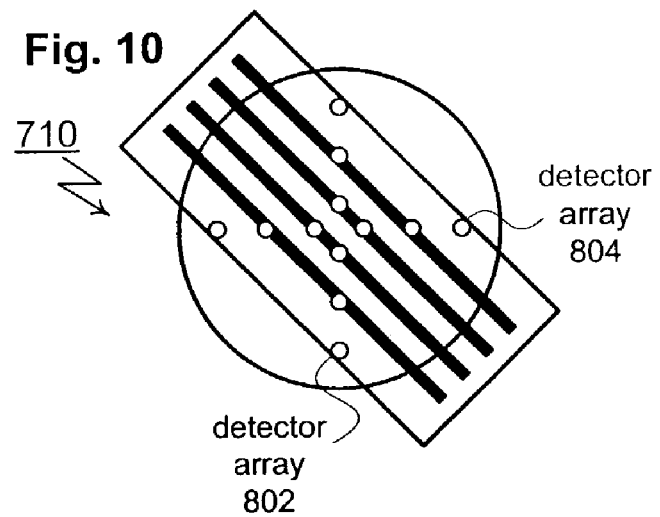
FIG. 10 is a block diagram showing an alternate alignment between an asymmetric subject and the detector of FIG. 8.

For some implementations, the parallel/perpendicular alignment shown in FIG. 9 may be replaced by an orientation where the line or grating structure is aligned at an acute angle to both detector arrays 802, 806. As shown in FIG. 10, an example would be an implementation where the line or grating structure is aligned at a forty-five degree angle to both detector arrays 802, 804. The analysis here is similar to the case of parallel/perpendicular alignment except that the outputs of both halves of both detector arrays 802, 804 are considered. As noted above, it is possible to use a full two dimensional array of detectors (e.g., a grid). A detector array of this type allows asymmetries to be determined along any axis.

FIGS. 7 through 10 describe a case where a structurally unmodified optical metrology system (a BPR system) is used to analyze asymmetric structures. It is important to appreciate that the same technique can be used to modify a range of optical metrology systems including beam profile ellipsometers (BPE) of monochromatic or polychromatic variants. BPR and BPE systems are described in detail in U.S. Pat. Nos. 4,999,014, 5,042,951, 5,181,080, 5,412,473, 5,596,411, and 6,429,943 as well as U.S. Pat. application Ser. No. 10/243,245, filed Sep. 13, 2002. Each of these documents is incorporated in this document by reference.

The output signals from the detectors shown in the Figures will be supplied to a processor (e.g. processor 712 of FIG. 7). The processor will analyze the signals based on an algorithm which considers the reflected and scattered light. The algorithms rely on the Fresnel equations. The analysis could be based on various analytical systems including Rigorous Coupled Wave Theory, or bounded or volume integral approaches.

In the preferred embodiment, the reflected output signals are analyzed to determine the asymmetries in the geometry of the structure. While there are a number of different approaches, most have certain traits in common. More specifically, the analytical approach will typically start with a theoretical "best guess" of the composition and asymmetric geometry of the measured structure. Using Fresnel equations covering both the reflection and scattering of light, calculations are applied to a theoretical model of the structure to determine what the expected measured output signals would be for the theoretical geometry. These theoretical output signals are compared to the actual measured output signals and the differences noted. Based on the differences, the processor will generate a new set of theoretical output signals corresponding to a different theoretical structure. Another comparison is made to determine if the theoretical signals are closer to the actual measured signals. These generation and comparison steps are repeated until the differences between the theoretically generated data and the actually measured data are substantially minimized. Once the differences have been minimized, the theoretical structure corresponding to the best fit theoretical data is assumed to represent the actual structure.

This minimization procedure can be carried out with a conventional least squares fitting routine such as a Levenberg-Marquardt algorithm. It would also be possible to use a genetic algorithm. (See, U.S. Pat. No. 5,953,446.)

Ideally, the minimization routine will be carried out in real time, associated with the measurements. Since the calculations related to this analysis are very complex, real time calculations can be a challenge. Some approaches for dealing with complex real time calculations are set forth in our co-pending PCT Application WO03/009063 cited above.

Another approach to dealing with the processing difficulties is to create a library of solutions prior to the measurement. In this approach, a range of possible structures and their associated theoretical output signals are generated in advance. The results are stored as a library in a processor memory. During the measurement activities, the actual measured signals are compared with sets of theoretically generated output signals stored in the library. The structure associated with the set of theoretical signals which most closely matches the actual measured data is assumed to most closely represent the geometry of the measured structure. The use of libraries is disclosed in U.S. patent Application 2002/0035455 A1. Still another approach is to create a much smaller database of possible solutions. Measured data can then be compared to the database and algorithms are used to interpolate between data points to derive a solution to the geometry of the structure. (See for example, U.S. patent Application 2002/0038196 A1)

It should be appreciated that the methods described above relate to both CD measurements of asymmetric lines and overlay measurements to distinguish whether overlay displacement is to the right or left of a line. The methods described above also include any and all possible combinations of SE, BB, BPR and BPE with CD and overlay capability. More specifically, it is known that measurement information from various technologies can be combined to improve the analysis of an unknown sample. Examples of combining measurement technologies are disclosed in some of the above cited references as well as in U.S. Pat. No. 6,278,519 incorporated herein by reference. A combination of information can be relatively simple such as averaging the results from two different measurements. Preferably, all of the measurements are combined and applied to a theoretical model to permit simultaneous regression to an optimal solution.

What is claimed is:

1. A method of optically inspecting and evaluating a subject including a potentially asymmetric structure, the method comprising:
    (a) directing an optical beam to be reflected by the subject;
    (b) measuring light reflected by the potentially asymmetric structure at two detector locations where the two detector locations are chosen to detect asymmetries in the reflected optical beam; and
    (c) analyzing the measurements made in step b to obtain information about a direction of asymmetry of the potentially asymmetric structure.

2. A method as recited in claim 1, which further comprises:
    (d) separately measuring light that is specularly and non-specularly reflected by the potentially asymmetric structure; and
    (e) analyzing the measurements made in steps d to obtain information about the direction of asymmetry of the potentially asymmetric structure.

3. A method of optically inspecting and evaluating a subject including a potentially asymmetric structure, the method comprising:
    (a) directing an optical beam to be reflected by the subject;
    (b) separately measuring light that is specularly and non-specularly reflected by the potentially asymmetric structure; and
    (c) analyzing the measurements made in step b to obtain information about a direction of asymmetry of the potentially asymmetric structure.

4. A method as recited in claim 3, which further comprises:
    (d) measuring light reflected by the potentially asymmetric structure at two detector locations where the two detector locations are chosen to detect asymmetries in the reflected optical beam; and
    (e) analyzing the measurements made in step d to obtain information about the direction of asymmetry of the potentially asymmetric structure.

5. An apparatus for evaluating asymmetric line structures on a sample comprising:
- a source of light for generating a probe beam;
- optics for focusing the beam on the line structure on the sample;
- a detector having a least two independent sensor regions and oriented to detect asymmetries in the reflection and scattering of the probe beam light from the sample, each sensor region generating output signals; and
- a processor for evaluating a direction of asymmetry in the geometry of the sample based on the output signals.

6. An apparatus for evaluating asymmetric line structures on a sample comprising:
- a source of light for generating a probe beam;
- optics for focusing the beam on the line structure on the sample;
- a detector having a least two independent sensor regions and oriented to detect asymmetries in the reflection and scattering of the probe beam light from the sample, each sensor region generating output signals; and
- a processor for evaluating the asymmetries in the geometry of the sample based on the output signals;
- wherein the detector includes a split detector having two halves and oriented to monitor radial asymmetries in the reflected probe beam.

7. An apparatus for evaluating asymmetric line structures on a sample comprising:
- a source of light for generating a probe beam;
- optics for focusing the beam on the line structure on the sample;
- a first detector positioned in the path of the specularly reflected probe beam and generating first output signals in response thereto;
- a second detector positioned to measure only scattered light outside of the path of the specularly reflected beam and generating second output signals; and
- a processor for evaluating a direction of asymmetry in the geometry of the sample based on the first and second output signals.

8. An apparatus for evaluating asymmetric line structures on a sample comprising:
- a source of light for generating a probe beam;
- optics for focusing the beam on the line structure on the sample with a spread of angles of incidence;
- a pair of orthogonal related detector arrays positioned in the path of the specularly reflected probe beam and generating output signals in response thereto; and
- a processor containing instructions to evaluate a direction of asymmetry in the geometry of the sample based on the output signals from the arrays.

* * * * *